United States Patent
Savelli et al.

(10) Patent No.: US 9,054,272 B2
(45) Date of Patent: Jun. 9, 2015

(54) OPTIMIZED THERMOELECTRIC MODULE FOR OPERATION IN PELTIER MODE OR IN SEEBECK MODE

(75) Inventors: Guillaume Savelli, Grenoble (FR); Philippe Coronel, Barraux (FR); Marc Plissonnier, Eybens (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 73 days.

(21) Appl. No.: 13/696,211

(22) PCT Filed: May 3, 2011

(86) PCT No.: PCT/FR2011/000270
§ 371 (c)(1),
(2), (4) Date: Jan. 11, 2013

(87) PCT Pub. No.: WO2011/138522
PCT Pub. Date: Nov. 10, 2011

(65) Prior Publication Data
US 2013/0104951 A1 May 2, 2013

(30) Foreign Application Priority Data

May 5, 2010 (FR) ..................................... 10 01929

(51) Int. Cl.
*H01L 35/28* (2006.01)
*H01L 35/30* (2006.01)
*H01L 35/32* (2006.01)

(52) U.S. Cl.
CPC ............. *H01L 35/28* (2013.01); *H01L 35/32* (2013.01)

(58) Field of Classification Search
CPC ........................... H01L 35/04; H01L 35/325
USPC ....................................... 136/208, 212, 228
See application file for complete search history.

(56) References Cited

U.S. PATENT DOCUMENTS

| | | | |
|---|---|---|---|
| 6,222,113 B1 * | 4/2001 | Ghoshal | 136/201 |
| 6,388,186 B1 * | 5/2002 | Nomura et al. | 136/224 |
| 6,700,052 B2 * | 3/2004 | Bell | 136/201 |
| 2006/0201161 A1 * | 9/2006 | Hirai et al. | 62/3.2 |

FOREIGN PATENT DOCUMENTS

| | | |
|---|---|---|
| JP | 2003-101084 A | 4/2003 |
| JP | 2009-231410 A | 10/2009 |
| WO | WO 96/15412 | 5/1996 |
| WO | WO 2005/001946 A1 | 1/2005 |

OTHER PUBLICATIONS

Jul. 5, 2011 International Search Report issued in International Application No. PCT/FR2011/000270.

(Continued)

*Primary Examiner* — Eli Mekhlin
(74) *Attorney, Agent, or Firm* — Oliff PLC (57) ABSTRACT

The thermoelectric module includes a first electric path including a first set of thermocouples electrically connected in series. It further includes a second electric path including a second set of thermocouples electrically connected in series, the number of thermocouples of the second set being smaller than the number of thermocouples of the first set.

7 Claims, 11 Drawing Sheets

(56) References Cited

OTHER PUBLICATIONS

Jan. 12, 2015 Office Action issued in Chinese Patent Application No. 201180033154.5.

Mar. 6, 2015 Office Action issued in Japanese Patent Application No. 2013-508533.

* cited by examiner

OPTIMIZED THERMOELECTRIC MODULE FOR OPERATION IN PELTIER MODE OR IN SEEBECK MODE

BACKGROUND OF THE INVENTION

The invention relates to a thermoelectric module comprising:
a first electric path connecting a first input and a first output of the module, and comprising a first set of thermo-couples electrically connected in series.

STATE OF THE ART

Figure 1:
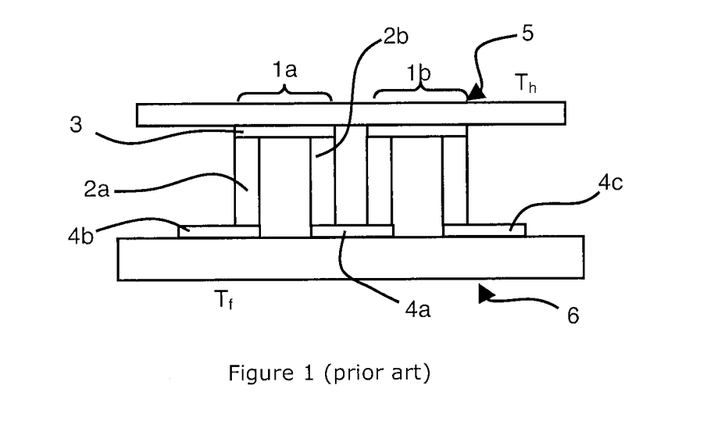
FIG. 1 illustrates a thermoelectric module with two thermocouples according to the prior art.

A conventional architecture of a thermoelectric module with two thermo-couples 1a, 1b is illustrated in FIG. 1. Each thermocouple 1a, 1b comprises two legs 2a, 2b connected to one another at one of their ends by an electric connecting element 3. A first leg 2a is preferably formed from a P-type material and a second leg 2b is preferably formed from an N-type material. The module can comprise a plurality of thermocouples 1a, 1b as described above placed in series and connected to one another by metal connectors 4a to optimize the efficiency of the module. Metal connectors 4b, 4c are located at the ends of the series of thermocouples to form the electric connections of the module. In other words, the thermocouples are electrically connected in series and thermally connected in parallel.

The thermoelectric module can be used either in Seebeck mode or in Peltier mode. It comprises a hot side reservoir 5 at a temperature $T_h$ and a cold side reservoir 6 at a temperature $T_f$.

In Seebeck mode, the module produces energy from a temperature gradient between the hot side 5 and the cold side 6. This mode is also called power generator mode.

In Peltier mode, application of a current at the terminals of the module enables a temperature gradient to be generated between the hot side 5 and cold side 6. This mode is also called cooling mode.

The efficiency of the thermoelectric module does in fact depend on the materials used, on the geometry of the module, and on the environment of use. A module is thus either optimized for cooling mode or optimized for power generator mode, but never for both at the same time.

The document WO-96/15412 describes a thermoelectric module comprising thermocouples using the Peltier effect. The thermocouples each comprise two legs having specific and different electric properties and/or dimensions. The legs are arranged in cascade and are connected to one another by an element made from conducting material so as to obviate the need for providing insulation means between the thermo-couples of two stages of the cascade.

The document WO-2005/001946 describes a Peltier effect thermoelectric module comprising at least two sets of thermocouples. Each set of thermo-couples comprises an input and an output. The sets of thermocouples are arranged above one another so as to be separated by an insulating layer.

SUMMARY OF THE INVENTION

The object of the invention is to provide a thermoelectric module that can be optimized both for power generator mode and for cooling mode.

This object tends to be achieved by the appended claims and in particular by the fact that each thermocouple of the first set and of the second set comprises two legs made from conducting material electrically connected to one another, and by the fact that said module comprises means for short-circuiting legs of the first set thereby forming the second set of thermo-couples.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS

Unlike modules of the prior art, the thermoelectric module and its embodiments described in the following enable optimal operation of the module in Peltier mode and in Seebeck mode by the use of two electric paths enabling the number of thermocouples used to be varied.

In the following, a thermocouple defines an element comprising two legs electrically connected to one another, preferably at one of their ends, by an electrically conducting and preferably thermally conducting connecting element. The legs of one and the same thermocouple are preferably formed from two different materials, for example a P-doped material and an N-doped material. It is possible to use semi-metals (Bi, Sb, etc.) or degenerated semi-conductor materials such as Si and SiGe. The materials used will in fact depend on the environment of use of the module, and the person skilled in the art will therefore be able to choose the material suitable for use of the thermoelectric module.

Figure 2:
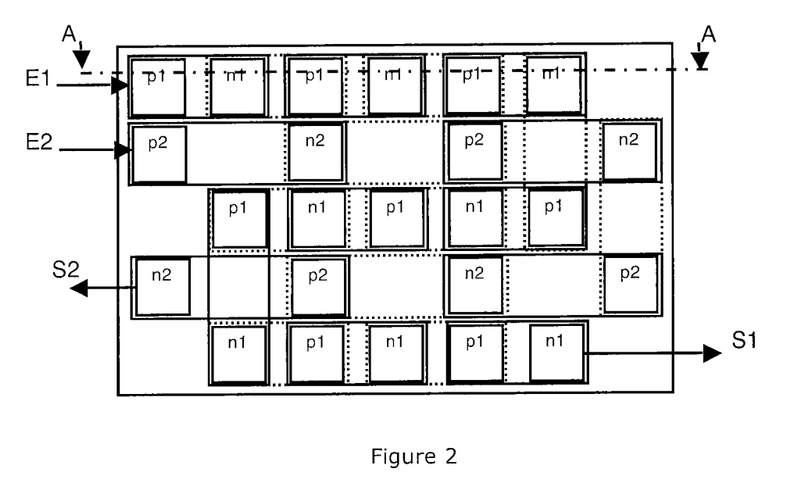
FIG. 2 illustrates, in top view, a first embodiment of a thermoelectric module optimized both for Peltier effect and for Seebeck effect.

In general manner, a thermoelectric module, for example such as the one illustrated in FIG. 2, can comprise a plurality of thermocouples. A first electric path connecting a first input E1 and a first output S1 of the module comprises a first set of thermocouples p1, n1 electrically connected in series, and a second electric path connecting a second input E2 and a second output S2 of the module, comprises a second set of thermocouples p2, n2 electrically connected in series. The number of thermocouples of the second set is smaller than the number of thermocouples of the first set.

The inputs/outputs of the module can correspond to two terminals enabling the module to be electrically connected to a current generator or to an accumulator according to the use.

The variation of a number of legs, and therefore of thermocouples, in fact enables either the electric power generated (Seebeck effect) or the cooling power of the module (Peltier effect) to be favoured.

In other words, according to the parameters of the module, the first path can form a Peltier effect module, and the second path can form a Seebeck effect module. The path associated with the Peltier effect is not necessarily longer than the Seebeck path, resulting in the fact that the first path can form a Seebeck effect module and the second path can form a Peltier effect module, this all depending on the geometry and materials used.

In Seebeck effect mode, the object is to obtain the maximum electric power $Q_{gen}$, and in Peltier effect mode, the object is to obtain the greatest cooling power $Q_{cold}$.

For example purposes it is possible to characterize a module taking account of the parameters defined below in table I:

TABLE I

| Type | Parameter | Variable | Values |
|---|---|---|---|
| Thermal parameters | Hot reservoir temperature | $T_h$ | 350 K |
| | Cold reservoir temperature | $T_f$ | 300 K |
| Material parameters | Seebeck coefficient | S | 4,00E−04 V/K |
| | Thermal conductivity | λ | 1.5 W/m/K |
| | Electric resistivity | ρ | 1.60E−05 Ω · m |
| | Matrix thermal conductivity | $\lambda_{air}$ | 0.026 W/m/K |
| Geometric parameters | Number of legs | n | VAR |
| | Leg-edge of device separation | distance | 1.00E−04 m |
| | Length and thickness of legs | L | 4.00E−05 m |
| | Leg size | b | 8.00E−06 m |
| | Surface of legs | $A_{np}$ | 6.40E−11 m² |
| | Space between two legs | d | VAR in m |
| | Module surface | $A_{te}$ | 1.00E−04 m² |
| Heat exchange parameters | Thermal diffusion surface | $A_{hs}$ | 2.00E−04 m² |
| | Heat transfer coefficient | h | 1.00E+03 W/m²/K |
| Electric parameters | Contact resistance | $R_c$ | 1.00E−11 Ω · m² |
| | Internal resistance of the device | $R_{int}$ | VAR in Ω |

In this table, the thermal parameters define the temperatures at the terminals of the thermocouples in Kelvin (with hot side at $T_h$ and cold side at $T_f$).

The parameters of the materials define the characteristics of the materials used to form the legs such as the Seebeck coefficient S, thermal conductivity λ, electric resistivity ρ, and thermal conductivity of the matrix $\lambda_{air}$ corresponding to the conductivity of the material present between the legs (in the example the material involved is air).

The geometric parameters define the module by the number n of legs (with n/2 being equal to the number of thermocouples), the height L of the legs, the cross-section $A_{np}$ of the legs defined in the present case by a square having sides with a dimension b, the space d between two adjacent legs, the surface of the module $A_{te}$ on which the legs are distributed, and the leg-edge distance separating the outermost legs from the edge of the module (for problems of technological fabrication).

The heat exchange parameters with the environment define the heat exchange surface $A_{hs}$ between the cold side of the module and the environment, and the heat transfer coefficient h between the hot side of the module and the environment, h can for example be defined by water in forced convection.

The electric parameters define the electric contact resistance $R_c$ corresponding to the electric resistance between a leg and its connecting element, and the internal resistance $R_{int}$ corresponding to the internal resistance of the module measured at the terminals of the series of thermo-couples comprising the contact resistances and the electric resistances of the legs.

With such parameters, the electric power in Seebeck mode and the cooling power in Peltier mode can be written in the form of equations. The equations that follow are based on a model taking account of the parameters involved from an electric and thermal point of view, and of the parameters linked to the environment in which the module will be placed. Although the cold side temperature is at the temperature $T_f$, it does not really correspond to the cold temperature of the thermocouple, which is in fact at a temperature $T_c$ that is higher than the temperature $T_f$. It is therefore the temperature difference of the module $T_h$-$T_c$ that is taken into account in the equations and not the temperature difference of the environment $T_h$-$T_f$.

In the particular example of an embodiment that follows, the thermoelectric material used is a nanostructured material of Quantum Dot SuperLattice (QDSL) type based on germanium nanodots. The different legs are separated by air, whence the presence of $\lambda_{air}$.

The electric power $Q_{gen}$ in Seebeck mode can therefore be expressed according to the equation:

$$Q_{gen} = \frac{N^2 \times S^2 \times (T_h - T_c(N))^2}{4 R_{int}^2(N) \times A_{hs}} \qquad (1)$$

In the equation (1), $T_c$ is an unknown and depends on N, as is the internal resistance $R_{int}$, and N represents the number of thermocouples (N=n/2).

$R_{int}$ can be defined according to the equation:

$$R_{int}(L) = 2N \times \left( \frac{\rho \times L}{A_{np}} + \frac{2 R_c}{A_{np}} \right) \qquad (2)$$

To know the expression of $T_c$, the equation presenting the balance of powers input at the level of the thermoelectric module with the heat output from the cold side has to be written, i.e.:

$$P_{Seeb} + P_{cond} + P_j = P_{hs} \qquad (3)$$

where $P_{Seeb}$ represents the Seebeck effect, $P_{cond}$ represents the heat transfer by conduction, $P_j$ the losses by Joule effect and $P_{hs}$ the heat transfer by convection. These four terms make use of $T_c$, and result in solving of the equation:

$$\left( \frac{2N \times \lambda \times \Delta T \times A_{np}}{L} + \frac{\lambda_{air} \times \Delta T \times (A_{te} - 2N \times A_{np})}{L} \right) + \qquad (4)$$
$$N \times S \times T_c \times I + \frac{1}{2} R_{int} \times I^2 = (T_c - T_f) h A_{hs}$$

where $\Delta T$ represents the temperature difference between $T_h$ and $T_c$, $\lambda_{air}$ the thermal conductivity of the air, and I the current flowing through the thermo-couples.

Figure 3:
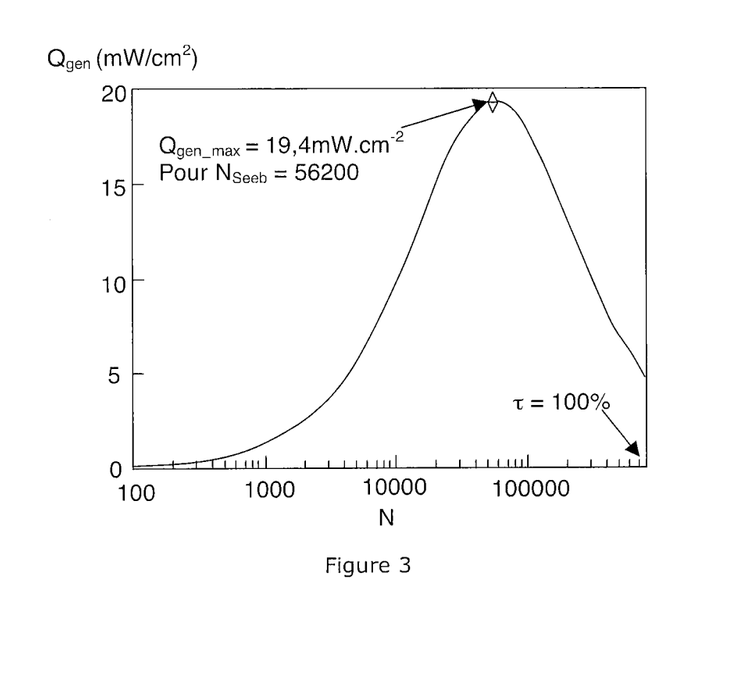
FIG. 3 illustrates the power generated by a module in Seebeck mode according to the number of thermocouples of this module.

This equation (4) shows that $T_c$ is also a function of the parameter N. Equations (1) and (4) thus demonstrate the dependence of $Q_{gen}$ according to the number N of thermo-couples. According to the variables fixed in table I, FIG. 3 illustrates the variation of $Q_{gen}$ versus the number N of thermo-couples, where τ represents the filling ratio of the legs with respect to the available surface. In this FIG. 3, it is possible to observe an optimum point $Q_{gen\_max}$ of 19.4 mW·cm$^{-2}$ for a number of thermocouples $N_{Seeb}$ of 56,200.

This value $N_{Seeb}$ can also be obtained analytically by solving the equation:

$$\left(\frac{\partial(Q_{gen})_{max}}{\partial L}\right)_{N=N_{Seeb}} = 0 = \left(\frac{\partial\left(\frac{N^2 \times S^2 \times (T_h - T_c(N))^2}{4 \times (R_{int}(N))^2 \times A_{hs}}\right)}{\partial N}\right)_{N=N_{Seeb}} \quad (5)$$

Tests were also performed for Peltier mode. Taking account of the Peltier effect, Joule effect and the thermal conduction, the cooling power of a thermoelectric module favouring Peltier effect can be written in the form:

$$Q_{cold} = N \times S \times I \times T_c(N) - \tfrac{1}{2} R_{int}(N) \times I(N)^2 - K(N) \times (T_h - T_c(N)) \quad (6)$$

This equation (6) also makes use of the variable N representative of the number of thermocouples, I the current flowing through the series of thermo-couples, and where K(N) represents the total thermal conductance defined by:

$$K(N) = \frac{2N \times \lambda \times A_{np}}{L} + \frac{\lambda_{air} \times (A_{te} - 2N \times A_{np})}{L} \quad (7)$$

Figure 4:
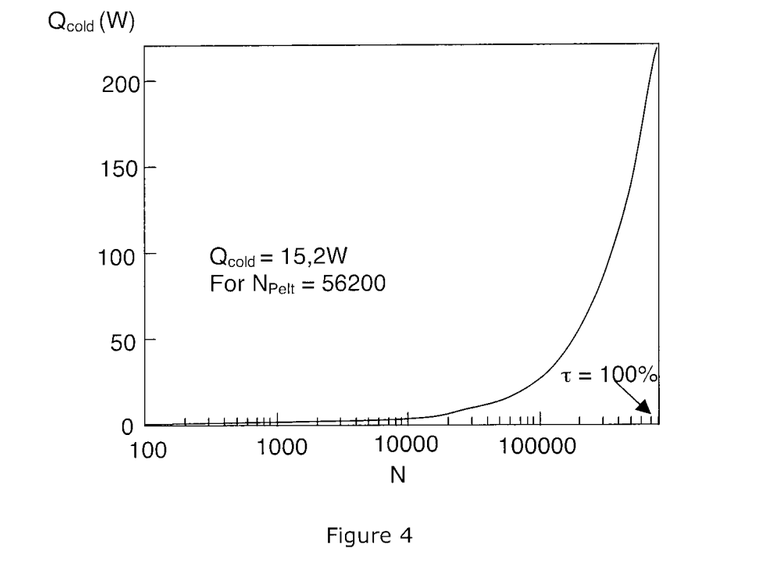
FIG. 4 illustrates the cooling power generated by a module in Peltier mode according to the number of thermocouples of this module.

By application of equations (6) and (7), FIG. 4 represents the variation of $Q_{cold}$ according to the number of thermo-couples, where τ represents the filling ratio of the legs with respect to the available surface. In the present case, the input parameters are different from Seebeck mode. Thus, an input current equal to 10 mA flows through the series of thermo-couples. Under these conditions, a module having the same number of thermocouples as the module favouring Seebeck effect would, as illustrated in FIG. 4, generate a power $Q_{cold}$ of 15.2 W. This value is far from being optimal, FIG. 4 does indeed show that by doubling the number of thermocouples (going from 56,200 to 112,400), it is possible to obtain 31 W under the same conditions i.e. an increase of about 100% of the performances.

This justifies the particular advantage of the described module which can be adapted to the situation (operation in Seebeck mode or in Peltier mode) by proposing different electric paths.

The demonstration described above applies to two distinct modules. The problem of integrating two paths within a single module in fact resides in the fact that, if the two effects are to be optimized to the full, account has to be taken of the total number of thermocouples $N_{tot}$ which corresponds to addition of the thermocouples reserved for operation in Seebeck mode $N_{Seeb}$ and of the number of thermocouples reserved for operation in Peltier mode $N_{pelt}$. Indeed, if the first and second paths are electrically independent, all the thermocouples are nevertheless thermally active on account of the temperature gradient between the hot side and the cold side of the module.

Thus, in the equations defined in the foregoing, a distinction must be made between the thermocouples intervening electrically and the thermocouples intervening thermally. In generator (Seebeck) mode, equations (1) and (4) then respectively become:

$$Q_{gen} = \frac{N_{Seeb}^2 \times S^2 \times (T_h - T_c(N_{tot}, N_{Seeb}))^2}{4R_{int}^2(N_{Seeb}) \times A_{hs}} \quad (8)$$

and $$\left(\frac{2N_{tot} \times \lambda \times \Delta T \times A_{np}}{L} + \frac{\lambda_{air} \times \Delta T \times (A_{te} - 2N \times A_{np})}{L}\right) + \quad (9)$$
$$N_{Seeb} \times S \times T_c \times I + \tfrac{1}{2} R_{int}(N_{Seeb}) \times I^2 = (T_c - T_f)hA_{hs}$$

Likewise, in cooling mode, equations (6) and (7) respectively become:

$$Q_{cold} = N_{Pelt} \times S \times I \times T_c(N_{tot}, N_{Pelt}) - \quad (10)$$
$$\tfrac{1}{2} R_{int}(N_{Pelt}) \times I^2 - K(N_{tot}) \times (T_h - T_c(N_{tot}, N_{Pelt}))$$

and $$K(N_{tot}) = \frac{2N_{tot} \times \lambda \times A_{np}}{L} + \frac{\lambda_{air} \times (A_{te} - 2N_{tot} \times A_{np})}{L} \quad (11)$$

In the last four equations, it is apparent that, to optimize the module, the right number of thermocouples corresponding either to an electric term ($N_{Seeb}$ or $N_{pelt}$) or to a thermal term ($N_{tot}$) have to be taken into account.

According to the geometry, the above equations thus enable the module to be optimized to the full for both effects.

Figure 5:
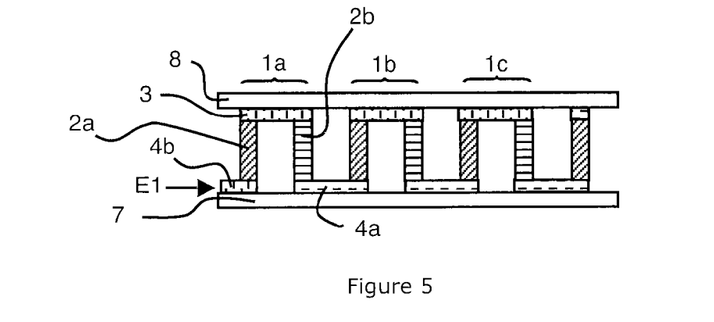
FIG. 5 illustrates a cross-sectional view along the line A-A of FIG. 2.

In a first embodiment illustrated in FIGS. 2 and 5, the module integrates two distinct electric paths. In other words, the first and second sets of thermo-couples are not joined. The first path is optimized to favour for example the Peltier effect, i.e. operation in cooling mode of the module. This first path is defined by first input E1 and first output S1 and comprises eight thermo-couples connected in series, i.e. 16 legs, preferably alternately formed from different materials so as to form eight pairs (p1, n1). The second path is optimized to favour for example the Seebeck effect, i.e. operation in current generator mode. This second path is defined by second input E2 and second output S2 and comprises four thermocouples connected in series, i.e. eight legs p2, n2 forming four pairs (p2, n2). In FIG. 2, the first and second inputs are distinct and the first and second outputs are distinct.

Naturally, as mentioned above, the Peltier optimized path is not necessarily longer than the Seebeck path.

Thus, in FIG. 2, the choice of input E1 and output S1 will determine use of the module for example in cooling mode, and the choice of input E2 and output S2 will determine use of the module in generator mode. For this, a selector of switch type can be fitted on the input and on the output of the module to connect one or the other of the inputs/outputs (E1, E2, S1, S2).

FIG. 5 represents a cross-sectional view along the line A-A of FIG. 2. It preferably contains three thermocouples 1a, 1b, 1c connected in series by connectors 4a between a bottom support 7, forming for example the cold reservoir, and a top support 8, forming for example the hot reservoir. Each thermo-couple comprises a first leg 2a and a second leg 2b connected to one another by a connecting element 3, preferably located between the ends of the legs and top support 8. In the example embodiment of FIG. 5, connectors 4a are formed on bottom support 7 and are preferably placed between the associated legs and bottom support 7. The first leg 2a of first thermocouple 1a can be connected to a connector 4b acting as input E1. The leg situated at the right-hand end of FIG. 5 constitutes the first leg of the following thermocouple.

According to an alternative embodiment that is not represented, legs p1 and p2 at the level of inputs E1 and E2 of FIG. 2 are electrically connected at their base at the level of the bottom support. The module thus comprises a single input common to the two paths and two distinct outputs. The simple choice of output S1, S2 then enables the operating mode to be selected, for example by using a two-state switch. According to the same principle, it is also possible for the module to comprise a single output and two distinct inputs.

By applying the values of table I, calculations made from equations (8) to (11) show an optimization of the module for an optimized number of Seebeck thermocouples of 3134 and an optimized number of Peltier thermocouples of 3899, i.e. a total 7033 of thermocouples present in the module. In generator mode, the module will provide a power density $Q_{gen}$ of 3.4 mW/cm2, and in cooling mode a thermal power $Q_{cold}$ of 0.03 mW. Such a module enables the two functionalities to be optimized within the same module.

The fabrication method of a module according to the first embodiment with two distinct electric paths can comprise deposition of an electrically conducting film on a base substrate, followed by patterning of the latter so as to delineate connectors of Seebeck type and connectors of Peltier type. A stack of thermoelectric material is then deposited above the Seebeck and Peltier connectors. A pattern is formed above the thermoelectric stack so as to delineate the different legs which will be associated with the Seebeck optimized thermocouples and with the Peltier optimized thermocouples. This pattern is then etched down to the substrate or to the Seebeck/Peltier connectors. The different legs can then be sunk in an electrically insulating layer, and this electrically insulating layer then be flattened so as to leave the free end of the legs flush. After the legs have been formed, they can be doped so as to obtain an alternation of a first and second type of doping (preferably P-type and N-type) for each path.

A second electrically conducting film is then deposited on the stack (above the electrically insulating layer and the free end of the legs), and is then etched down to the insulating layer with a top pattern enabling the connecting elements between the legs of the same thermocouple to be delineated. This top pattern comprises two different shapes, one shape designed for forming connecting elements for the Seebeck optimized path and another shape designed for forming connecting elements for the Peltier optimized path.

In a second embodiment illustrated in FIGS. 6 to 9, the first and second sets have thermocouple elements in common. In other words, the second electric path is formed in the first electric path from elements of the first electric path. In fact these thermocouple elements can be legs, connecting elements, or connectors.

Each thermocouple of the first set and of the second set thus comprises two legs made from conducting material, electrically connected to one another, and said module comprises means (9a, 9b, 9c, 9d) for short-circuiting the legs of the first set thereby forming the second set of thermocouples.

Figure 6:
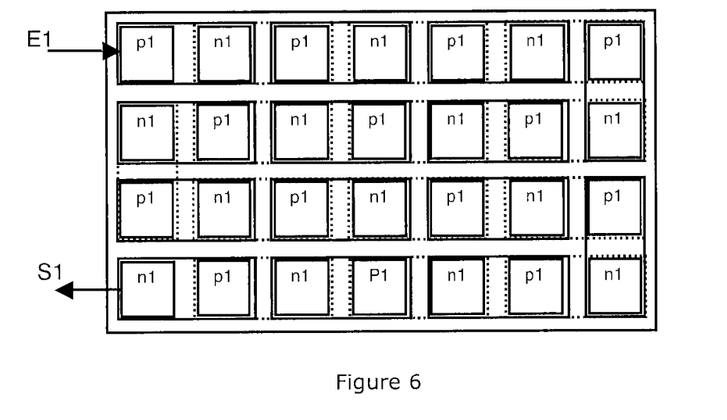
FIG. 6 illustrates a top view of a module according to a second embodiment.

FIG. 6 illustrates a thermoelectric module, in top view, comprising fourteen thermocouples (p1, n1) forming a series of thermocouples defining the first electric path, i.e. forming a Peltier optimized module in the example embodiment. In FIG. 6, the series of thermocouples p1, n1 is formed by several rows connected to one another in series at the level of one of their ends.

Figure 7:
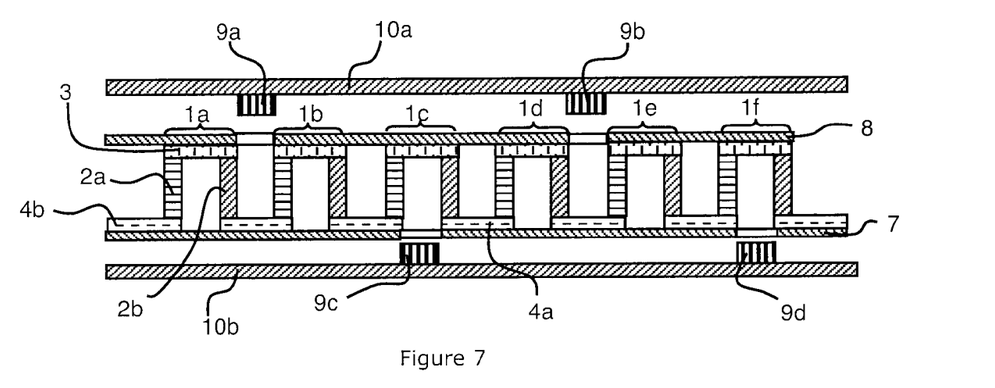
FIGS. 7 and 8 illustrate cross-sectional views of a module of the type of that of FIG. 6, FIG. 7 representing Peltier mode and FIG. 8 representing Seebeck mode.

A cross-sectional view along a row of a module of the type of that of FIG. 6 is illustrated in FIG. 7. In this FIG. 7, the short-circuiting means are for example formed by electrically conducting elements 9a, 9b, 9c, 9d, maintained at a distance from the thermocouples of the first path in a first state of the module.

In FIG. 7, the module is for example Peltier optimized, i.e. all the thermo-couples are active. In the particular case of the example, the row comprises six thermocouples 1a, 1b, 1c, 1d, 1e, 1f, each thermocouple comprising a first leg 2a and a second leg 2b connected to one another by a connecting element 3, preferably located between the ends of legs 2a, 2b and a top support 8, forming for example the hot reservoir. In the example embodiment of FIG. 7, connectors 4a are formed on bottom support 7 forming for example the cold reservoir, so as to connect the six thermocouples 1a, 1b, 1c, 1d, 1e, 1f in series. These connectors 4a are preferably fitted between the associated legs and bottom support 7. First leg 2a of first thermocouple 1a can be connected to a connector 4b then acting as input E1. Holes are drilled in bottom support 7 and top support 8 at specific locations to enable passage of conducting elements 9a, 9b, 9c, 9d designed to short-circuit certain legs of thermocouples to form new thermocouples in a second state of the module, in order to optimize the module for Seebeck effect.

In other words, the conducting elements are in electric contact with legs of thermocouples of the first path in a second state of the module so as to form the second path in the first path.

In this embodiment, the first input and second input are preferably common and the first output and second output are preferably common.

In FIG. 7, the holes, at the level of top support 8, are formed between the second leg of first thermocouple 1a and the first leg of second thermocouple 1b, and between the second leg of fourth thermocouple 1d and the first leg of fifth thermocouple 1e. These holes are formed so as to let conducting elements 9a, 9b pass to directly connect connecting elements of two adjacent thermocouples to one another. Furthermore, bottom support 7 comprises holes formed between the first leg of third thermocouple 1c and the second leg of third thermocouple 1c, and between the first leg of fifth thermocouple 1f and the second leg of fifth thermocouple 1f. These bottom holes are formed so as to let conducting elements 9c, 9d pass to directly connect connectors 4a of the same thermocouple. This particular example is naturally only an embodiment that the person skilled in the trade will be able to modify according to the destination of the module.

Figure 8:
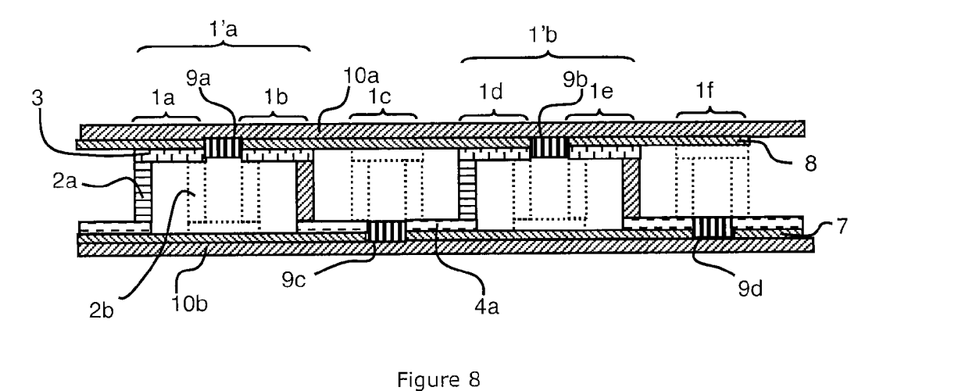
Figure 9:
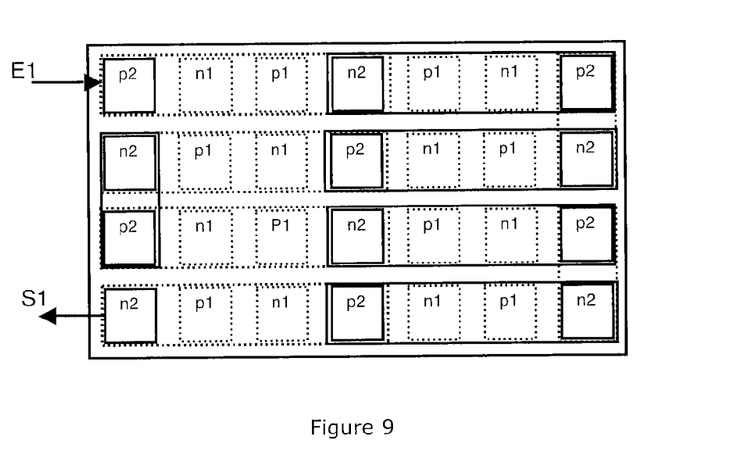
FIG. 9 illustrates a top view of a module according to the second embodiment when the latter is optimized for Seebeck mode.

FIG. 8 illustrates the same cross-sectional view of the module of FIG. 7, the only difference being that the electrically conducting elements 9a, 9b, 9c, 9d are in short-circuit position to form for example a Seebeck optimized module. The row therefore only comprises two active thermocouples $1'_a$ and $1'_b$, called Seebeck thermocouples in the example. The first Seebeck thermo-couple $1'_a$ of FIG. 8 is formed by the first leg of first thermocouple 1a of the Peltier optimized row and the second leg of second thermocouple 1b of the Peltier optimized row. These two legs are then electrically connected to one another by the connection of first thermocouple 1a of the Peltier optimized row, a first electrically conducting element 9a, and the connecting element of second thermocouple 1b of the Peltier optimized row.

Second thermocouple Seebeck $1'_b$ of FIG. 8 is formed by the first leg of fourth thermocouple 1d of the Peltier optimized row and the second leg of fifth thermocouple 1e of the Peltier optimized row. These two legs are electrically connected to one another by the connecting element of fourth thermocouple 1d of the Peltier optimized row, a second electrically conducting element 9b at the level of top support 8, and the connecting element of fifth thermocouple 1e of the Peltier optimized row. The two thermocouples Seebeck $1'_a$ and $1'_b$ are connected in series by two adjacent connectors $4a$ electrically connected by a third electrically conducting element $9c$ at the level of bottom support 7, in FIG. 8, this series connection being formed by short-circuiting of third thermocouple $1c$ of the Peltier optimized row.

Sixth thermocouple $1f$ of the Peltier optimized row is rendered inactive by a fourth conducting element $9d$ at the level of bottom support 7 to terminate the new Seebeck optimized row.

In FIG. 8, the different elements of FIG. 7 which have become inactive are represented by broken lines. In other words, the module that can be seen in FIG. 6 resembles the module of FIG. 9, in Seebeck mode, and only comprises six active thermocouples p2, n2 instead of fourteen initial thermo-couples, inactive legs p1 and n1 being represented by broken lines.

In the particular example of FIGS. 7 and 8, the means for short-circuiting operation comprise a respectively top and bottom first and second movable plate $10a$, $10b$. Each plate is equipped with a conducting elements arranged in such a way that, when plates $10a$, $10b$ are moved towards the module, conducting elements $9a$, $9b$, $9c$, $9d$ can come and short-circuit certain thermocouples to form new ones.

First and second plates $10a$, $10b$ can be respectively substantially parallel to top support 8 and bottom support 7, and the conductive elements respectively associated to first plate $10a$ and to second plate $10b$ are arranged on the latter so as to be facing associated holes drilled in bottom support 7 and top support 8. In other words, the conducting elements are supported by first and second movable plates $10a$, $10b$ arranged on each side of the thermocouples, preferably perpendicularly to the legs of the latter.

Figure 25:
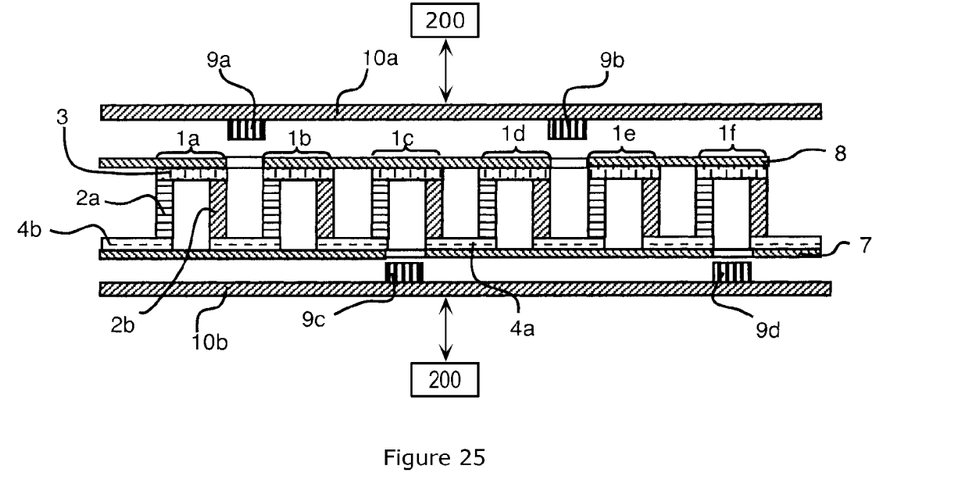
FIG. 25 illustrates a cross-sectional view of a module in Peltier mode having a micro-electromechanical system.
Figure 26:
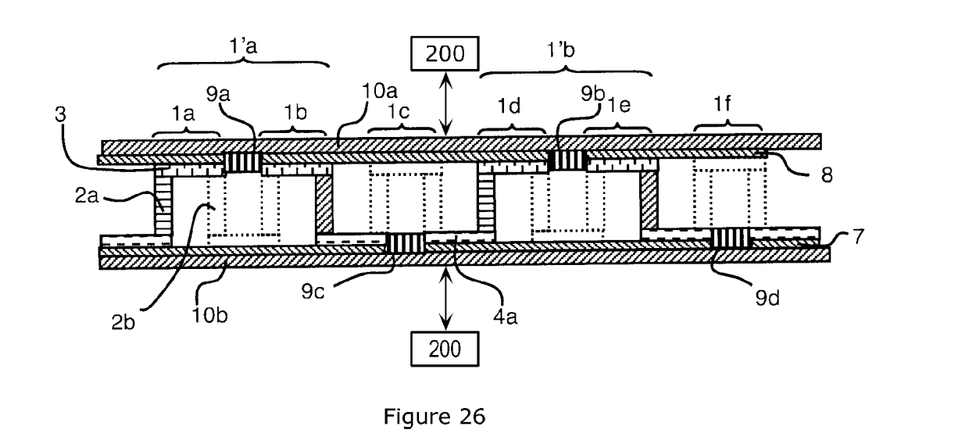
FIG. 26 illustrates a cross-sectional view of a module in Seebeck mode having a micro-electromechanical system.

First and second plates $10a$, $10b$ can be set in motion by using micro electromechanical systems (MEMs) 200, as shown in FIGS. 25 and 26. The plates can for example be formed by membranes able to move when a stimulation is applied via the MEMs 200.

Short-circuiting of certain thermocouples enables new thermocouples spaced further apart from one another to be formed using legs of different thermo-couples of the first path. For example purposes, the short-circuiting means can divide the number of active thermocouples of the module by two when switching from Peltier optimized mode to Seebeck optimized mode.

The second embodiment enables the efficiency to be improved and parasite effects to be reduced. Thus, such a module for a total number of thermo-couples of 56,200 supplies a cooling power of 15.2 W in Peltier mode using all the thermocouples, and a power of 9.7 mW·cm$^{-2}$ in Seebeck mode for a number of thermocouples of 28,100. The performances associated with these two modes are excellent and enable equivalent performances to be obtained in cooling to a module that is solely Peltier optimized and provides an increased power density in generator mode.

Figure 10:
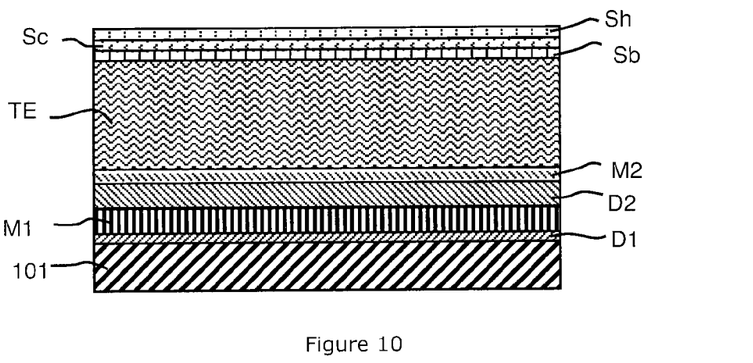
FIGS. 10 to 24 illustrate different steps of a fabrication of a module according to the second embodiment.

The fabrication method of the module according to the second embodiment can, as illustrated in FIG. 10, comprise successive deposition on a support substrate 101 of a first electrically insulating layer D1, a first electrically conducting layer M1, a second electrically insulating layer D2, a second electrically conducting layer M2, a layer of thermoelectric material TE, a bottom sacrificial layer Sb, a central sacrificial layer Sc and a top sacrificial layer Sh.

The stack achieved in this way will be used to form the bottom part of the thermoelectric module.

Figure 11:
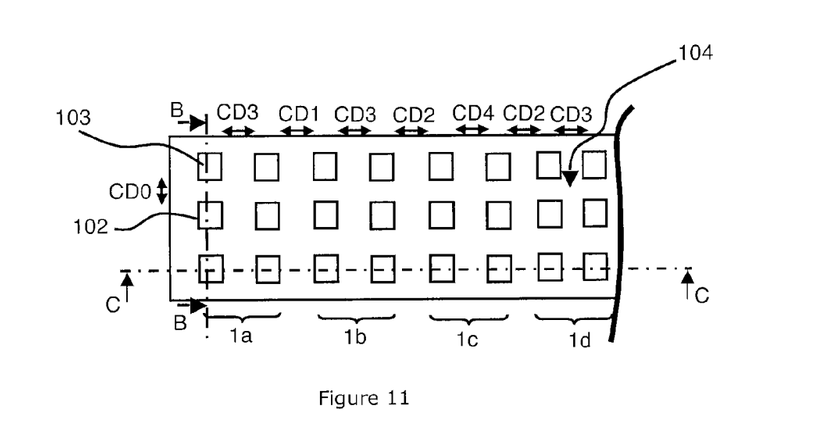

First of all, a pattern is formed on the stack so as to delineate legs. FIG. 11 illustrates a top view of the stack on which a pattern 102 designed to delineate three rows of eight legs 103 is formed. The stack is then etched according to pattern 102 up to second electrically conducting layer M2 as in FIG. 12 which is a cross-sectional view along the line C-C of FIG. 11. In the particular example of FIGS. 11 and 12, each row will comprise four thermocouples $1a$, $1b$, $1c$, $1d$ connected in series so as to preferably optimize the Peltier effect. Preferably, two adjacent legs of the same row are made from different materials, for example alternatively p-doped and n-doped legs. The thermoelectric material can be doped, for example by ion implantation, just after the etching step according to pattern 102.

Figure 12:
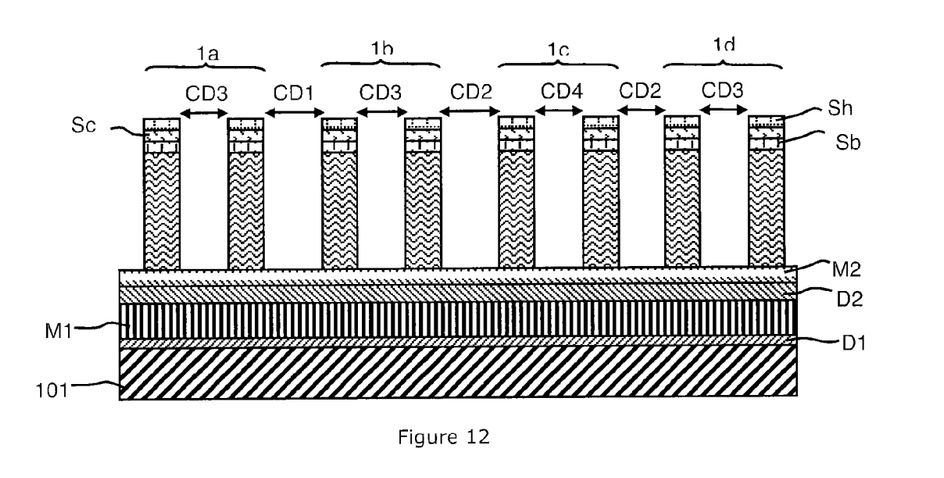

In FIG. 11, the inter-row space is defined by a distance CD0, which in fact corresponds to the minimum distance between two facing legs of two adjacent rows. In FIGS. 11 and 12, from left to right and at the level of each row, first thermocouple $1a$ comprises two legs separated by a distance CD3, then first thermocouple $1a$ is separated from second thermocouple $1b$ by a distance CD1, second thermocouple $1b$ comprises two legs separated by a distance CD3, second thermocouple $1b$ is separated from third thermocouple $1c$ by a distance CD2, third thermocouple $1c$ comprises two legs separated by a distance CD4 and third thermocouple $1c$ is separated from fourth thermocouple $1d$ by a distance CD2, then the cycle is repeated if the rows comprise more than four thermocouples, in the figure the fourth thermocouple comprises two legs separated by a distance CD3. In order to facilitate self-alignment when fabrication is performed, we have CD0>CD4>CD3>CD2>CD1, i.e. a succession of wide and narrow distances. Naturally, the following module can also be achieved with any distances between two adjacent legs of one and the same row, meaning that conventional photolithography and etching steps will be able to be used, but which will not facilitate self-alignment. After etching according to pattern 102, each of the distances defined above delineates void spaces separating the different legs and rows.

After etching up to second electrically conducting layer M2, the space between two rows (of transverse dimension CD0) is filled by a sacrificial inter-row material 104. This inter-row material is formed so as to fill the space between two rows defined by CD0. The inter-row material thus forms a bar in contact with all the legs of two adjacent rows at the level of the lateral walls of the legs of the two rows facing one another. In other words, after deposition of inter-row material 104, two opposite side walls covered by the inter-row material and two other free side walls are obtained for each leg. It is possible to fill the inter-row spaces in two stages, in a first step conformal deposition of a material fills all the spaces with the exception of the inter-row spaces which remain open. Etching then removes the conformal-deposited material at the level of the inter-rows only, then in a second step the inter-row material is deposited. This method using conformal deposition requires CD0 to be greater than the distances CD1, CD2, CD3, CD4. Another method consists in depositing the inter-row material directly, and in then selectively removing the latter by photolithography followed by etching so as to only leave material at the level of the inter-row spaces.

Figure 13:
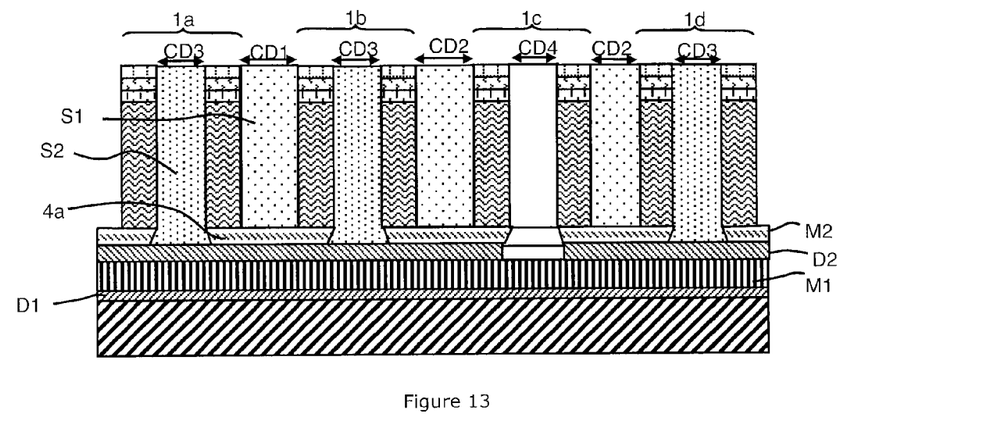

In FIG. 13, after localization of the inter-row material, the space between two adjacent thermocouples $1a$, $1b$, $1c$, $1d$ is filled by a first sacrificial material S1. In other words, a void area/leg/filled area/leg alternation is obtained. In the particular case of self-alignment, the spaces defined by distances CD1 and CD2 of FIG. 12 are filled by first sacrificial material S1. This filling can be performed selectively by conformal deposition followed by etching, provided that the distance separating two legs of the same thermo-couple is greater than the distance separating two adjacent thermocouples (CD3 and CD4 are greater than CD1 and CD2). If not, it is also possible to perform deposition followed by a photolithography and etching step to fill only the spaces defined by distances CD1 and CD2.

Then, in the free areas (i.e. at the level of the spaces defined by CD3 and CD4), second electrically conducting layer M2 is etched until second insulating layer D2 is flush, preferably with isotropic etching enabling lateral etching of second electrically conducting layer M2 as in FIG. 13. This enables the different connectors 4a to be shaped.

After second electrically conducting layer M2 has been etched, the spaces between the legs of thermocouples 1a, 1b, 1d are filled by a second sacrificial material S2. In other words, in FIG. 13 there is only one space between two legs that is open, the space being that defined by the distance CD4. Second sacrificial material S2 can be localized by conformal deposition followed by etching, the distance CD3 then being smaller than the distance CD4 so as to leave the space defined by CD4. Naturally, it is also possible to perform deposition of the second sacrificial material S2 followed by a photolithography and etching step so as to only leave CD4 open.

After deposition of second sacrificial material S2, second insulating layer D2 is etched in anisotropic manner up to first electrically conducting layer M1 (FIG. 13).

Figure 14:
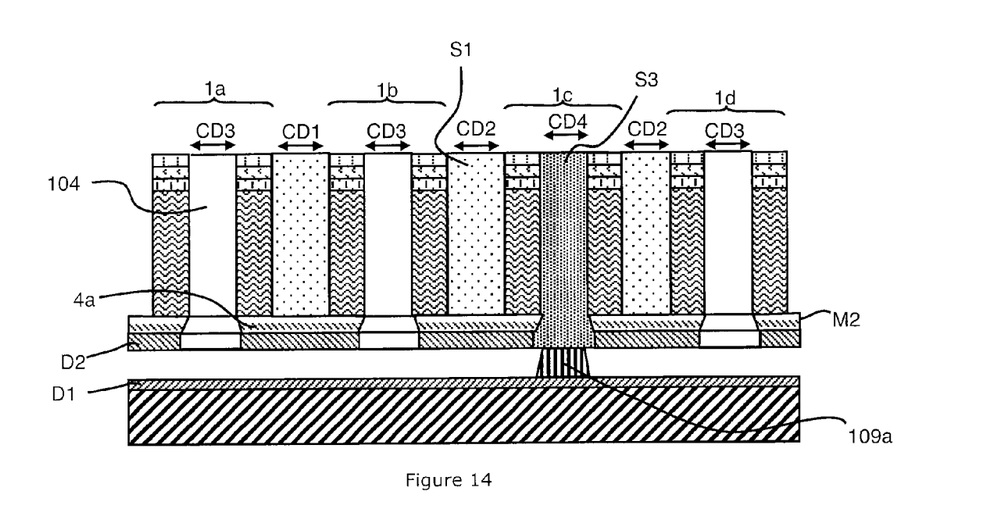

In FIG. 14, consecutively to etching of second insulating layer D2, the space between the legs of third thermocouple 1c, i.e. the existing void area defined by the distance CD4, is filled by a third sacrificial material 53. Second sacrificial material S2 is then selectively removed to make second insulating layer D2 accessible at the level of the spaces defined by the distances CD3, i.e. between the two legs of thermocouple 1a, the two legs of thermocouple 1b and the two legs of thermocouple 1d. At this time, second insulating layer D2 is selectively removed up to first electrically conducting layer M1.

First electrically conducting layer M1 is thus accessible via the spaces defined by the distances CD3. This electrically conducting layer M1 is then etched by isotropic etching until electrically conducting elements 109a are delineated, in the form of a salient parts, at the level of each space defined by CD4.

Figure 15:
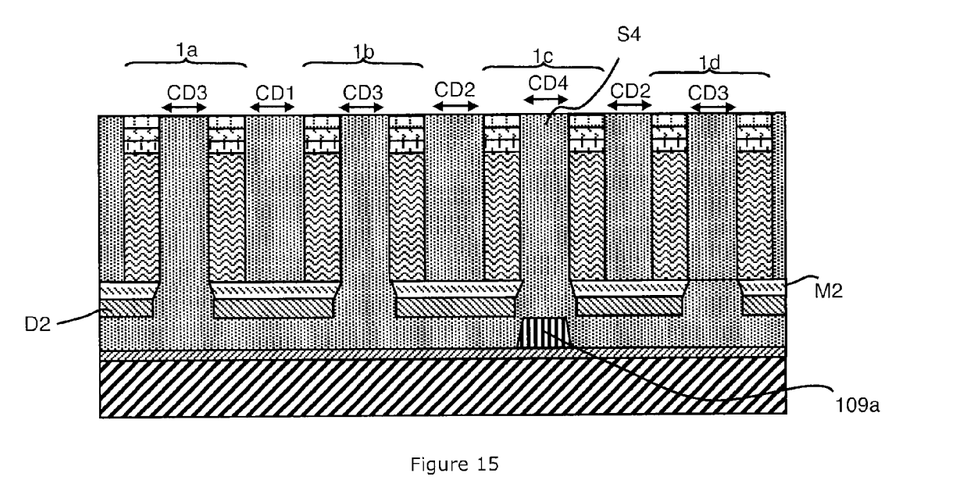

After formation of conducting element 109a, at the level of each row, all the sacrificial materials with the exception of the inter-row material are eliminated, i.e. remaining materials S1 and S3, and the void areas are then filled by a fourth sacrificial material S4 as illustrated in FIG. 15. It is naturally possible to leave sacrificial materials S1 and S3 in place and to fill the spaces with fourth material S4. Deposition of fourth sacrificial material S4 can be followed by levelling of the structure until it is flush with the rest of top sacrificial layer Sh. Fourth sacrificial material S4 can also be deposited so as to fill at least the spaces between the different legs so as to form a continuous film flush with top sacrificial layer Sh, and terminating underneath the level of bottom sacrificial layer Sb.

The bottom part of the module is at present completed, the connections at the top part remaining to be provided.

Figure 16:
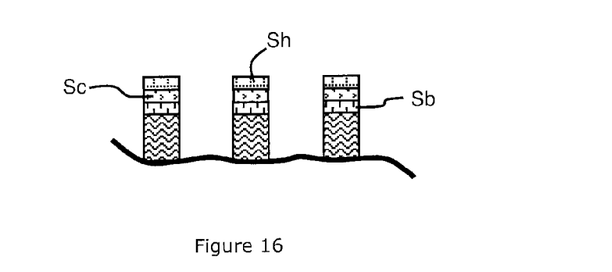

FIG. 16 illustrates a cross-sectional view along the line B-B of FIG. 11 after formation of the bottom part and removal of the inter-row material at the level of all the rows to reach the lateral surfaces of central sacrificial layer Sc.

Figure 17:
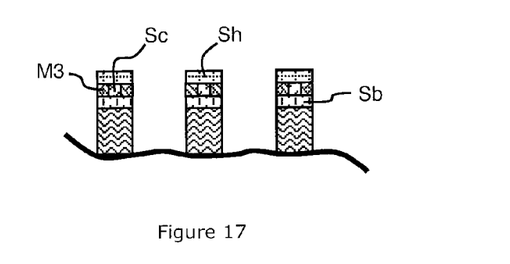

FIG. 17 illustrates the result obtained after partial selective etching, for example by isotropic etching, of central sacrificial layer Sc at the level of each leg, a third layer of electrically conducting material M3 being deposited so as to fill the void created by partial selective etching. Two embedded electrically connecting patterns are then obtained on two opposite faces at the level of each leg.

Figure 18:
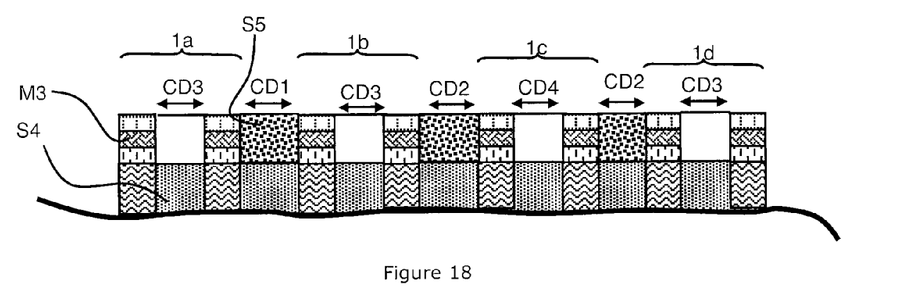

The inter-row spaces are then again filled by an inter-row material (which can be the same as the previously deposited material), and the fourth sacrificial material S4 is selectively removed between each leg up to the level of bottom part of bottom sacrificial layer Sb, as illustrated in FIG. 18 (cross-sectional view along the line C-C of FIG. 11), so as to release the lateral surfaces of bottom sacrificial layer Sb. After partial removal of fourth sacrificial material S4, a fifth sacrificial material S5 is deposited so as to only fill the spaces defined at the level of the distances CD1 and CD2, i.e. between first and second thermocouples 1a, 1b, between second and third thermocouples 1b, 1c, and between third and fourth thermocouples 1c, 1d in FIG. 18. This can be achieved as before by deposition followed by photolithography and then etching, or conformal deposition followed by etching (CD3 and CD4 being greater than CD1 and CD2).

Figure 19:
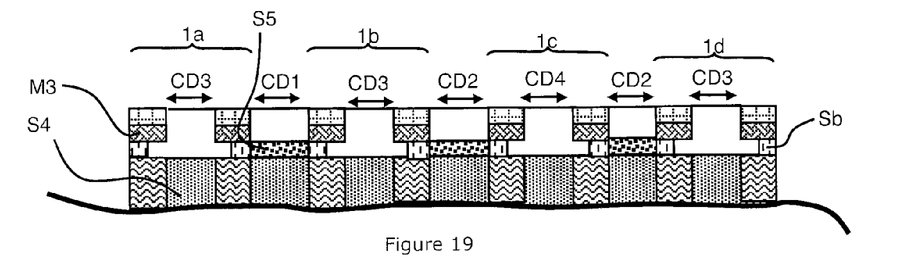

After deposition of fifth sacrificial material S5, bottom sacrificial layer Sb is partially etched in isotropic manner, and fifth sacrificial material S5 is then removed down to the bottom part of the central sacrificial layer, i.e. the bottom part of layer M3 as illustrated in FIG. 19.

Figure 20:
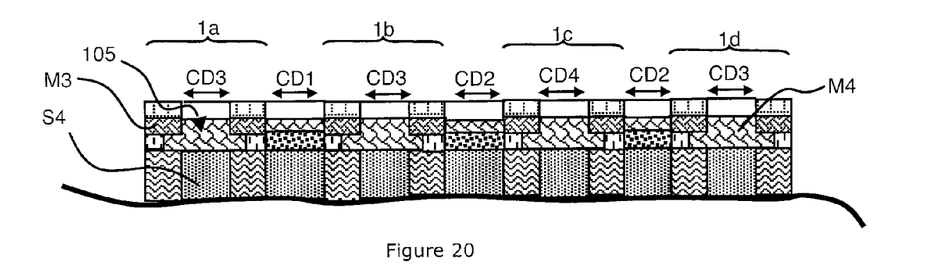

A fourth electrically conducting layer M4 is then deposited, this deposition being followed by levelling until it is flush with the inter-row material, followed by removal of fourth electrically conducting layer M4 up to the top part of central sacrificial layer Sc, according to the cross-sectional view of FIG. 20 this corresponds to the top part of third electrically conducting layer M3. At this moment, connecting elements 105 of thermocouples 1a, 1b, 1c, 1d have been formed at the level of the spaces defined by distances CD3 and CD4.

Then (FIG. 21) the spaces left free are filled by a sixth sacrificial material S6 with the exception of the space defined by distance CD1, i.e. between first thermocouple 1a and second thermocouple 1b, so as to enable formation of a conducting element at this level.

Figure 21:
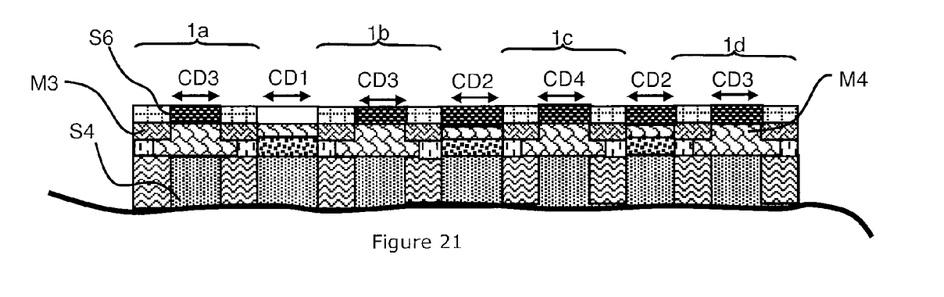
Figure 22:
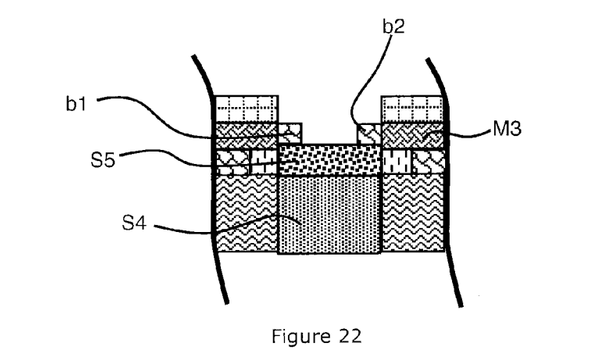
Figure 23:
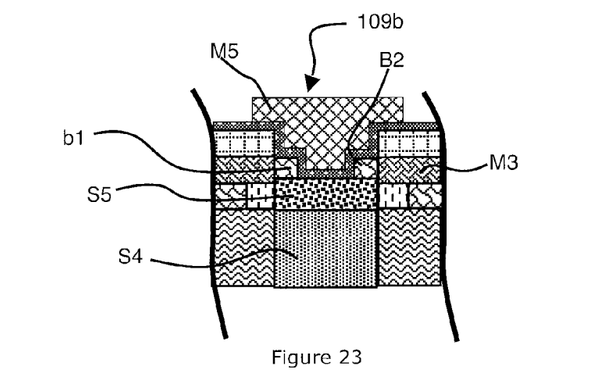

In FIG. 22 which is an enlargement of FIG. 21, at the level of space CD1, after deposition of sixth sacrificial material S6, fourth electrically conducting layer M4 can be selectively etched up to fifth sacrificial layer S5 so as to form two bars b1, b2 substantially parallel to one another, each of the bars being in contact with an opposite portion, at the level of two distinct adjacent legs, of electrically conducting layer M3 at the level of space CD1. The stack is then leveled by partially removing sixth sacrificial material S6 and top sacrificial layer Sh, but keeping the initial height of inter-row material 104 (FIG. 23). A seventh sacrificial layer S7 is then deposited, its thickness being substantially equal to that of partial removal of top sacrificial layer Sh. Then, as illustrated in FIG. 23, a fifth electrically conducting layer M5 is deposited so as to locally delineate a conducting element 109b at the level of the space defined by CD1. A membrane is then formed above the stack, element 109b thus formed by layer M5 being fixed to the membrane.

Figure 24:
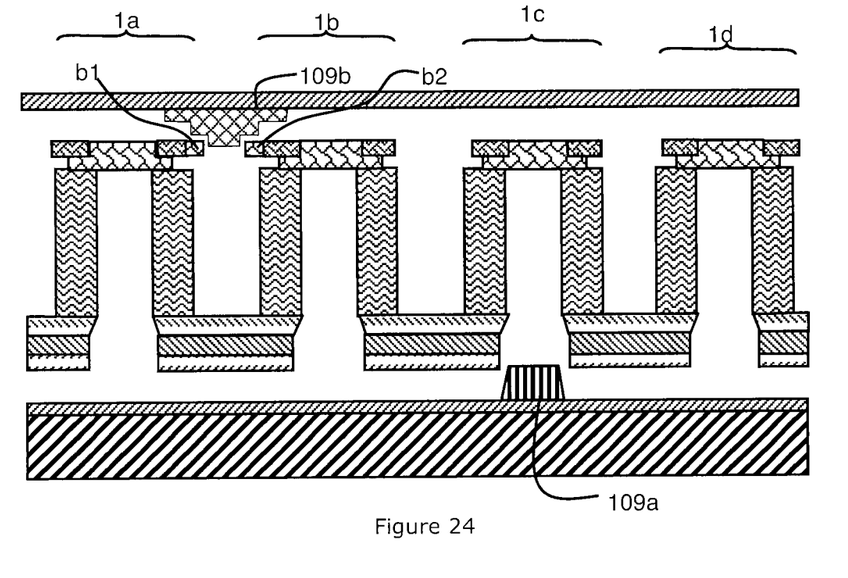

To finish, bottom Sb, central Sc, and top Sh sacrificial layers, and sacrificial materials S4, S5, S6 are removed to obtain the module according to FIG. 24 formed by four thermocouples 1a, 1b, 1c, 1d connected in series. Furthermore, the rest of metallic layer M4 is selectively removed at the level of the spaces defined by CD2 so as to prevent short-circuiting of second thermocouple 1b with third thermocouple 1c and of third thermocouple 1c with fourth thermocouple 1d.

In FIG. 24, a first conducting element 109a is designed to move to place the second leg of first thermocouple 1a in electric contact with the first leg of second thermocouple 1b, and a second conducting element 109a is designed to move to place the first leg of third thermocouple 1c in electric contact with the second leg of third thermocouple 1c, i.e. to short-circuit thermocouple 1c.

The invention claimed is:

1. A thermoelectric module comprising:
a first input and a first output of the thermoelectric module;
a second input and a second output of the thermoelectric module;
a first set of thermocouples electrically connected in series and connecting the first input with the first output, the first set of thermocouples being supported by a substrate provided with through hole, each thermocouple comprising first and second legs made from conducting materials, the first and second legs being electrically connected to one another so as to form the thermocouple;
a conducting element configured to cross the substrate via the through hole; and
a micro electromechanical system configured to reversibly move the conducting element toward and away from the substrate, the micro electromechanical system moving the conducting element reversibly between
a first position maintaining the conducting element at a distance from the first set of thermocouples, and
a second position maintaining the conducting element in the through hole so as to be in electric contact with two legs of the first set of thermocouples to short-circuit the two legs and to form a second set of thermocouples connected in series and connecting the second input with the second output, the second set of thermocouples having a quantity of thermocouples strictly lower than a quantity of thermocouples of the first set of thermocouples.

2. The module according to claim 1, further comprising
at least one plate arranged on one side of the first set of thermocouples, the conducting element being supported by the at least one plate and arranged facing the first set of thermocouples,
wherein the micro electromechanical system is configured to move the at least one plate toward and away from the first set of thermocouples to reversibly move the conducting element between the first position and the second position.

3. The module according to claim 1, wherein
one of the first set and the second set of thermocouples forms a Peltier effect module and the other set of thermocouples forms a Seebeck effect module.

4. The module according to claim 1, wherein
the first input and the second input of the module are electrically branched from a common module input, and the first output and the second output of the module are electrically branched from a common module output.

5. A thermoelectric module comprising:
a first input and a first output of the thermoelectric module;
a second input and a second output of the thermoelectric module;
a first set of legs arranged so as to form a first set of thermocouples electrically connected in series and connecting the first input with the first output, the first set of thermocouples being supported by a substrate provided with a through hole, each thermocouple comprising:
a first leg and a second leg made from conducting materials, each leg being provided with a first end and a second end opposite to the first end,
a first connecting element electrically connecting the first end of the first leg with the first end of the second leg so as to form said thermocouple,
each couple of a successive first thermocouple and a second thermocouple comprising a second connecting element arranged so as to electrically connect the second end of the second leg of the first thermocouple with the second end of the first leg of the second thermocouple so as to electrically connect in series the first and second thermocouples;
at least one conducting element configured to cross the substrate via the through hole; and
a micro electromechanical system configured to reversibly move the conducting element toward and away from the substrate, the micro electromechanical system moving the conducting element reversibly between
a first position maintaining the conducting element at a distance from the first set of thermocouples, and
a second position maintaining the conducting element in the through hole so as to be in electric contact with two legs of the first set of legs to short-circuit the two legs and to form a second set of thermocouples connected in series and connecting the second input with the second output, the second set of thermocouples having a quantity of thermocouples strictly lower than a quantity of thermocouples of the first set of thermocouples.

6. The module according to claim 5, further comprising
at least one plate arranged on one side of the first set of thermocouples, the conducting element being supported by the at least one plate and arranged facing the first set of thermocouples,
wherein the micro electromechanical system is configured to move the at least one plate toward and away from the first set of thermocouples to reversibly move the conducting element between the first position and the second position.

7. The module according to claim 5, wherein
the first input and the second input of the module are electrically branched from a common module input, and the first output and the second output of the module are electrically branched from a common module output.

* * * * *